United States Patent
Amou et al.

[11] Patent Number: 5,957,659
[45] Date of Patent: Sep. 28, 1999

[54] HEAT SINK APPARATUS

[75] Inventors: Mitsuru Amou; Koji Mehara, both of Usa, Japan

[73] Assignee: Matsushita Electric Industrial Co., Ltd., Osaka, Japan

[21] Appl. No.: 08/869,959

[22] Filed: Jun. 5, 1997

[30] Foreign Application Priority Data

Jul. 3, 1996 [JP] Japan ................................. 8-173250

[51] Int. Cl.⁶ .............................. F01D 5/08; H05K 7/20
[52] U.S. Cl. .................. 415/178; 415/211.1; 415/211.2; 361/697
[58] Field of Search ................................. 415/178, 177, 415/211.1, 211.2; 361/696, 697

[56] References Cited

U.S. PATENT DOCUMENTS

| | | | |
|---|---|---|---|
| 5,437,327 | 8/1995 | Chiou | 415/177 X |
| 5,504,650 | 4/1996 | Katsui et al. | 415/178 X |
| 5,559,674 | 9/1996 | Katsui | 361/697 |
| 5,582,506 | 12/1996 | Hong | 415/177 |
| 5,584,339 | 12/1996 | Hong | 361/697 X |
| 5,615,998 | 4/1997 | Kodama et al. | 415/177 |
| 5,638,895 | 6/1997 | Dodson | 361/697 X |
| 5,661,638 | 8/1997 | Mira | 361/697 |
| 5,690,468 | 11/1997 | Hong | 415/177 |

FOREIGN PATENT DOCUMENTS

| | | |
|---|---|---|
| 6-244575 | 9/1994 | Japan . |
| 7-111302 | 4/1995 | Japan . |
| 8-316380 | 11/1996 | Japan . |

*Primary Examiner*—John Ryznic
*Attorney, Agent, or Firm*—Stevens, Davis, Miller & Mosher, L.L.P.

[57] ABSTRACT

A heat sink apparatus for cooling a highly heat-generative semiconductor device in which a base of a heat sink is made larger in volume in its central portion than in its peripheral portion.

13 Claims, 4 Drawing Sheets

HEAT SINK APPARATUS

BACKGROUND OF THE INVENTION

1. Field of the Invention

This invention relates to a heat sink apparatus for cooling a highly heat-generative semiconductor device such as a microprocessing unit (hereinafter referred to as MPU).

2. Description of the Prior Art

Heretofore, heat sink apparatus have been used for cooling highly heat-generative semiconductor devices and the like. Particularly, in order to deal with a large amount of heat generated by a MPU or the like, a fan motor integrated type heat sink apparatus has recently been used in which a heat sink has a built-in miniature fan to assure a high cooling effect.

Description will be given below of a conventional heat sink apparatus. FIG. 3 is a partially cut-away front view of a conventional heat sink apparatus, and FIG. 4 is a side view of the conventional heat sink apparatus partially shown in section taken on the line X-Y of FIG. 3.

In FIGS. 3 and 4, a motor 101 is a radial gap outer rotor type motor and an impeller 102 is a rotor having a plurality of vanes 103, the impeller 102 and the motor 101 for rotating the impeller 102 constituting a fan. A housing 104 of the motor 101 and an outer frame 106 are connected by means of arms 105. The outer frame 106 is fixed to a heat sink 107 by means of screws 110 or the like. The heat sink 107 is provided with a plurality of radiation fins 108 on a base 109 thereof. The base 109 has flat surfaces on both sides so that a heating element such as MPU can be mounted on one surface of the base 109 on which no fins 108 are provided. Rotation of the impeller 102 causes the vanes 103 to generate an air flow moving from an upper surface of the impeller 102 toward the base 109 of the heat sink 107 so as to let the air out of the heat sink 107 from the side.

With the above conventional construction, since the base of the heat sink was flat, the air flow generated by the fan could not be smoothly let out of the heat sink to cause an eddy to occur between a lower portion of the impeller and a central potion of the base to thereby increase the pressure loss of the air flowing through the fins. As a result, the cooling effect of the fan used for forcibly cooling the MPU by air was deteriorated, with the result that it was not always possible to obtain a heat sink apparatus having a sufficient cooling effect.

Further, since the base of the heat sink was flat, the air flow generated by the fan could not efficiently be let out of the heat sink to cause the eddy to occur between the lower portion of the impeller and the central portion of the base, giving rise to a problem of making a noise.

FIG. 5 shows a temperature distribution of a package of a MPU. In FIG. 5, reference numeral 205 denotes a temperature distribution curve in which the temperature difference between the central and peripheral portions of a package 202 is large because of the low thermal conductivity of the package 202 of a MPU 201. Reference numeral 203 denotes a cover of the package 202, and 204 denotes pins of the MPU. In the conventional heat sink apparatus whose height is made uniform, if the height of radiation fins is increased for the purpose of enhancing the cooling effect by heat radiation, the thickness of the base of the heat sink is made thinner to deteriorate the heat transfer efficiency, while if the thickness of the base is increased for the purpose of enhancing the cooling effect by heat transfer from the package central portion to the heat sink peripheral portion, the fins cannot be made high and hence the surface area of the fins is reduced to thereby deteriorate the cooling effect by heat radiation.

SUMMARY OF THE INVENTION

It is an object of the present invention to provide a compact heat sink apparatus which has a high cooling effect by enhancing all the cooling effects due to heat transfer, heat radiation and forced-air cooling and which can achieve noise reduction.

In order to achieve the object, according to the invention, a base of a heat sink is made thick in its central portion and thin in its peripheral portion. It is therefore possible to efficiently transfer the heat in the central portion of a package of a MPU to the peripheral portion of the heat sink base and, as a result, it is possible to obtain a heat sink apparatus having a good cooling effect due to heat transfer by the heat sink.

Further, when the thickness of the base is made thin in the peripheral portion of the heat sink so as to make the height of the heat sink apparatus uniform, radiation fins in the peripheral portion of the heat sink can be increased in height, and therefore the surface area of the radiation fins becomes large to make it possible to enhance the cooling effect due to heat radiation by the fins.

Moreover, when the thickness of the base is made thin in the peripheral portion of the heat sink so as to make the height of the heat sink uniform, the area of the cross section through which the air flow caused by a fan is allowed to pass is widened, and therefore it is possible to reduce the pressure loss of the heat sink and increase the amount of air passing through the heat sink. As a result, it is possible to enhance the cooling effect due to forced-air cooling by the fan for cooling the heat sink apparatus.

In addition, by giving a slope to the base of the heat sink from the central portion to the peripheral portion thereof, it is possible to guide the air flow caused by a fan smoothly along the slope and hence to eliminate the occurrence of eddy between a lower portion of an impeller and the central portion of the base. This makes it possible to lower the pressure loss of the air flow moving through the fins and increase the amount of air passing through the heat sink. As a result, it is possible to enhance the cooling effect due to forced-air cooling by the fan for cooling the heat sink.

For these reasons, it is possible to obtain a compact heat sink apparatus which has an excellent cooling effect because of its capability of enhancing all the cooling effects due to heat transfer, heat radiation and forced-air cooling.

With such construction, furthermore, the air flow generated from the rotating fan can be guided smoothly along the slope of the base between the central portion and the peripheral portion, and therefore it is possible to eliminate the occurrence of eddy between the lower portion of the impeller and the base of the heat sink, thereby making it possible to obtain a heat sink apparatus which can achieve noise reduction.

DESCRIPTION OF THE PREFERRED EMBODIMENTS (First embodiment)

A first embodiment of the present invention will be described below with reference to the drawings.

Figure 1:
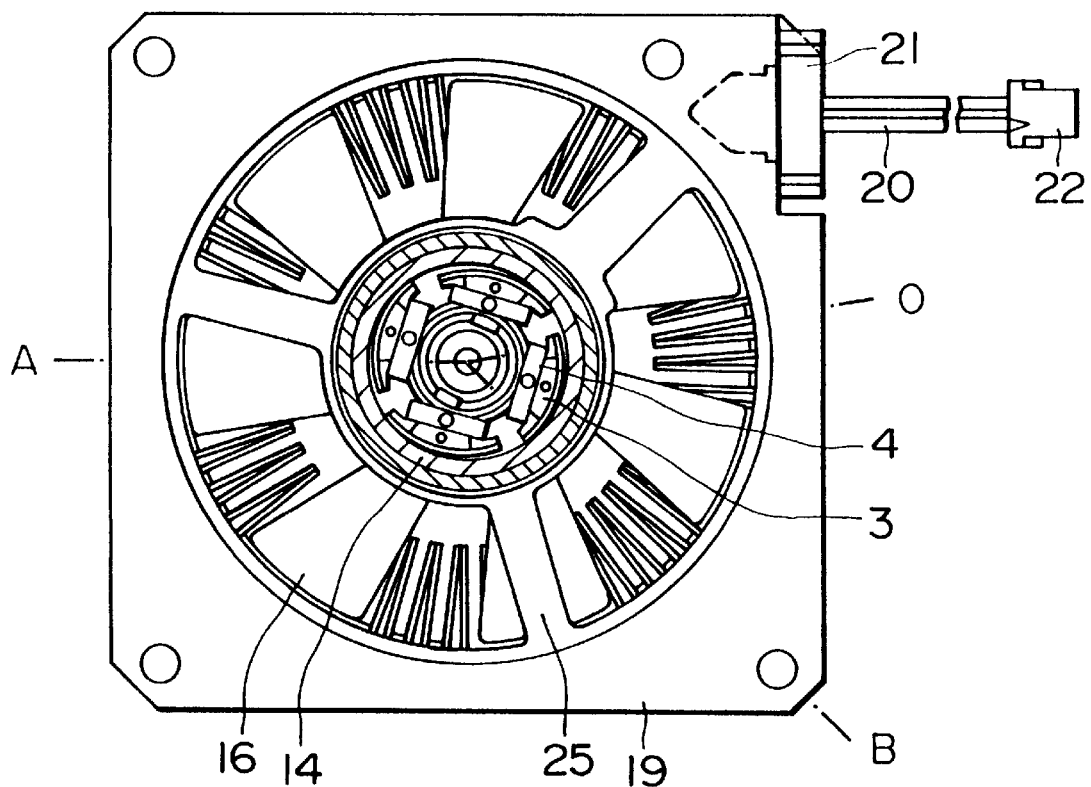
FIG. 1 is a front view of a heat sink apparatus according to a first embodiment of the present invention.
Figure 2:
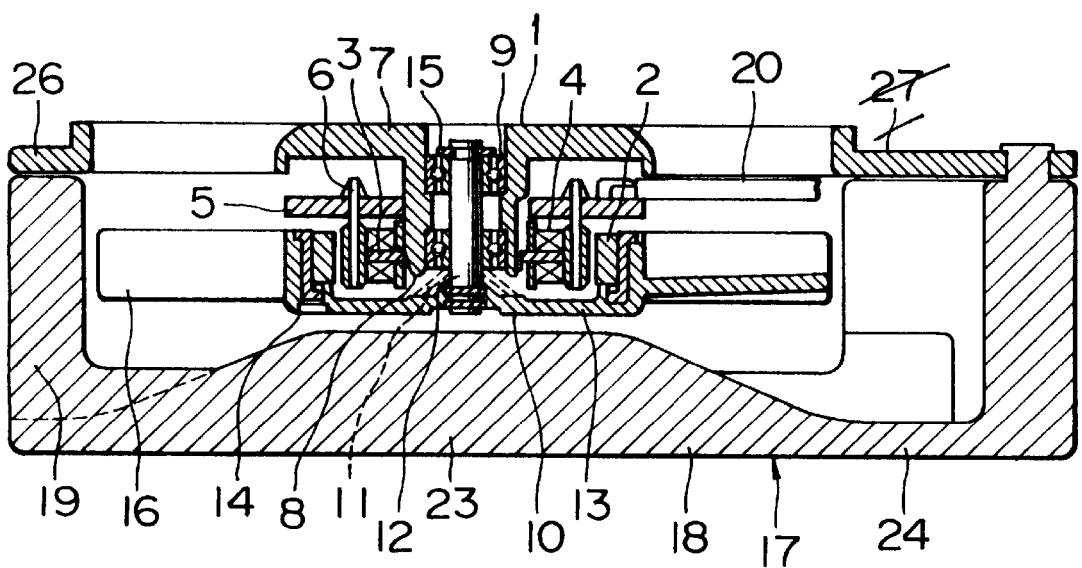
FIG. 2 is a sectional view of the heat sink apparatus according to the first embodiment of the invention taken along the line A-O-B of FIG. 1.
Figure 3:
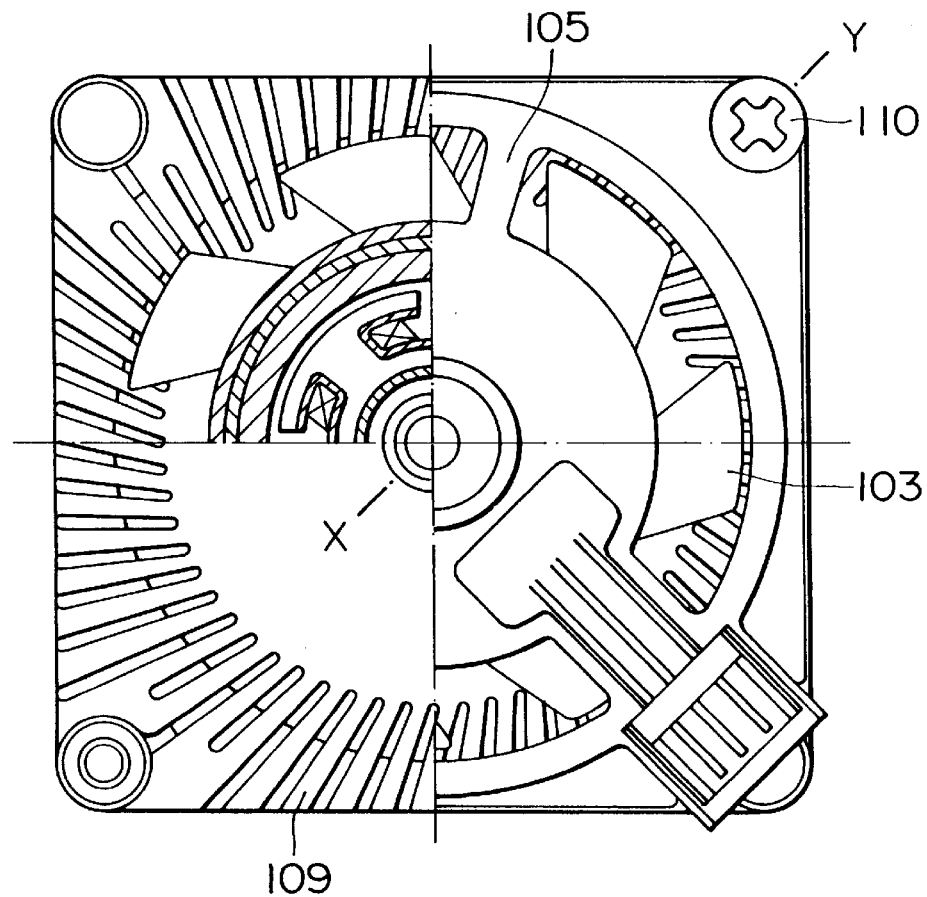
FIG. 3 is a partially cut-away front view of a conventional heat sink apparatus.
Figure 4:
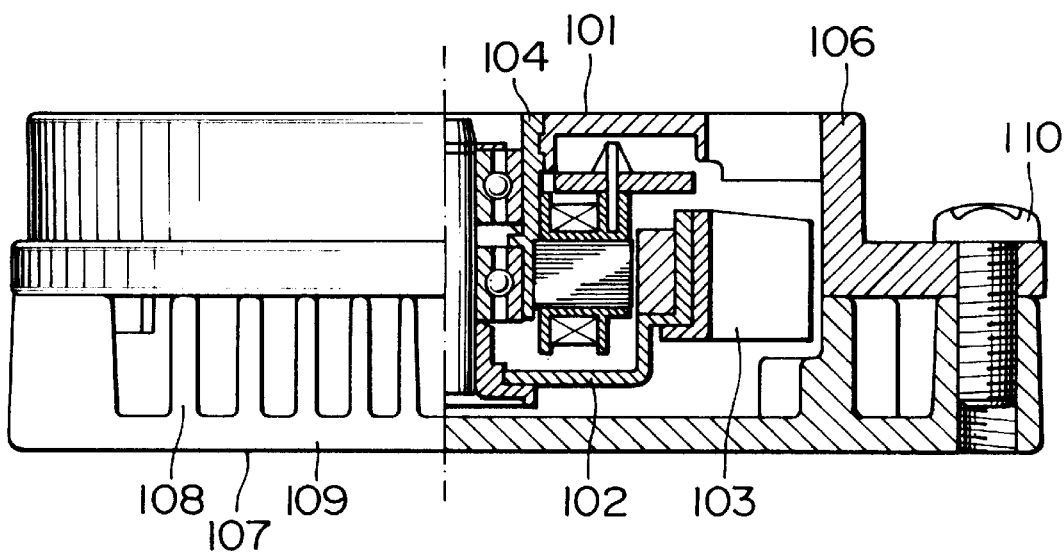
FIG. 4 is a side view of the conventional heat sink apparatus partially shown in section taken on the line X-Y of FIG. 3.
Figure 5:
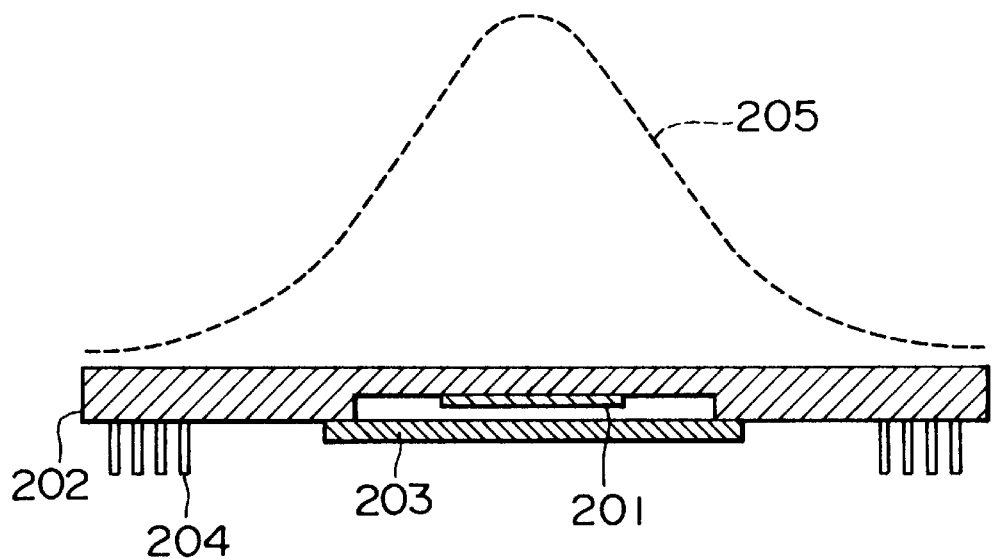
FIG. 5 is a temperature distribution view of a package of a MPU.

FIG. 1 is a front view of a heat sink apparatus according to a first embodiment of the invention, and FIG. 2 is a sectional view taken along the line A-O-B of FIG. 1.

In these drawings, a motor 1 is a radial gap outer rotor type DC brushless motor of two-phase half-wave or single-phase full-wave system. The motor 1 gains a rotation torque attributed to an interaction between a magnetic field produced by a four-pole magnet 2 and a rotating magnetic field produced by exciting coils 4 wound around a four-slot stator core 3 so as to be rotated in one direction. The stator core 3 is connected to a circuit board 5 constituting a drive circuit, by means of coil connecting pins 6, and fixed on a boss 8 provided on a housing 7.

Lead wires 20 connected by soldering to the circuit board 5 are fixed to an outer frame 26 by means of a resin bush 21 with the other ends thereof fitted into a connector 22.

Two ball bearings 9 encased in the housing 7 are used as bearing means, and a prestressed spring 11 is put between the ball bearing adjacent to an impeller 13 and a rotor 10 so that the ball bearing 9 is given with a predetermined pre-stress. A key 15 is fitted into an end groove of a shaft 12 to prevent the rotor 10 from coming off.

The impeller 13 is made of resin by a molding process in which a rotor yoke 14 and the shaft 12 are placed in a mold as inserts so as to appear as integral parts, the impeller 13 being formed with a plurality of vanes 16. The rotor 10 is constituted by the impeller 13 and the magnet 2 glued to the rotor yoke 14 of the impeller 13.

The housing 7 and the outer frame 26 are connected by means of arms 25, and the outer frame 26 is fixed to the four corners of a heat sink 17 by means of caulking. In this embodiment the outer frame 26 is fixed to the heat sink 17 by mean of caulking, but it is also possible to use screws, pins and other means.

The heat sink 17 is made of a material with high thermal conductivity such as aluminum by means of die casting, sintering or the like process. The material of the heat sink 17 is not limited to metal but it may be highly thermally conductive resin. The heat sink 17 has a base 18 whose thickness is made thick in a central portion 23 and thin in a peripheral portion 24, the base 18 being continuous from the central portion 23 to the peripheral portion 24 with an inclination. The heat sink 17 is provided with a plurality of radiation fins 19 extending radially outwardly from the central portion 23 of the base 18. The radiation fins 19 are arranged such that their inner peripheral ends surround the outer periphery of the impeller 13 and their outer peripheral ends reach the outer peripheral edge of the base 18 of the heat sink 17. The height of the fins 19 is changed stepwise so that they are prevented from coming in contact with the vanes 16 at their inner peripheral portions and they reach a predetermined height at their outer peripheral portions. The heat sink 17 is so constructed that the area of the cross section through which the air flow caused by the vanes 16 is allowed to pass is larger in the peripheral portion than in the central portion of the heat sink 17. This makes it possible to reduce the pressure loss of the heat sink 17. By using such heat sink 17, it is possible to reduce the noise and increase as high as possible the cooling effects due to heat transfer and heat radiation by the heat sink 17 and the cooling effect due to forced-air cooling by the air flow generated by the rotation of the vanes 16. The other surface of the base 18 of the heat sink 17, on which no fins 19 are provided, is substantially flat so that a heating element such as MPU can be mounted thereon by means of gluing or fixing with hooks, screws and other like.

In this embodiment, the thickness of the heat sink apparatus is approx. 18 mm, the base 18 of the heat sink 17 is approx. 49 by 49 millimeters square in external dimensions, and the contour of the central portion 23 of the base 18 is a circle with an outside diameter of approx. 12 mm. The inclination from the central portion 23 to the peripheral portion 24 of the base 18 is about 20 degrees. The thickness of the central portion 23 of the base 18 is approx. 6.5 mm and the thickness of the base peripheral potion 24 is approx. 2 mm.

Operation of the heat sink apparatus constructed as described above according to the first embodiment will now be described. The MPU mounted on the base 18 of the heat sink 17 generates a lot of heat in the central portion thereof, and the heat generated by the MPU is transferred to the base 18 of the heat sink 17. Since a high temperature portion of the MPU is in contact with the central portion 23 of the base 18 the temperature of the central portion 23 of the base is raised high. However, since the thickness of the central portion 23 of the base 18 is greater than that of the peripheral portion, the heat in the central portion 23 is efficiently transferred to the peripheral portion of the heat sink 17, thereby increasing the cooling effect due to heat transfer by the heat sink 17. When the heat sink 17 is made uniform in height, the radiation fins 19 can be increased in height at their portions located in the peripheral portion of the heat sink 17, and therefore it is possible to increase the surface area of the radiation fins 19 and enhance the cooling effect due to heat radiation by the fins 19. Further, by the rotation of the motor 1, the impeller 13 is rotated to cause the vanes 16 to rotate so that an air flow is generated which moves from an upper opening of the heat sink apparatus toward the base 18 of the heat sink 17 along the direction of the rotary shaft of the motor 1. The air flow is then guided along the slope of the base 18 of the heat sink 17 from the central portion 23 to the peripheral portion 24 so as to be let out of the heat sink 17 from the side thereof. At this time, the air flow can be guided along the slope of the base 18 and the occurrence of eddy between the impeller 13 and the central portion 23 of the base 18 can be eliminated, and therefore it is possible to reduce the pressure loss of the heat sink 17 and increase the amount of air passing through the heat sink 17. As a result, it is possible to enhance the cooling effect due to forced-air cooling by the vanes 16 for cooling the heat sink 17 and reduce the noise. Moreover, when the heat sink 17 is made uniform in height, the area of the cross section through which the air flow caused by the vanes 16 is allowed to pass is increased, and therefore it is possible to reduce the pressure loss of the air flow moving through the fins of the heat sink and increase the amount of air passing through the heat sink. In consequence, it is possible to enhance the cooling effect due to forced-air cooling by the fan for cooling the heat sink apparatus.

In this first embodiment, the motor used is a radial gap outer rotor type four-pole four-slot DC brushless motor of two-phase half-wave or single-phase full-wave drive system, but any of the motors of two-phase full-wave system, three-phase full-wave system, axial gap type and inner rotor type can be used. Further, the bearing means comprises two ball bearings, but it can comprise a fluid-film bearing or a metal sleeve. Whatever the radiation fins may be in the form of a pin, a star, a plate, or other anything, the effect of the invention can be achieved. Moreover, the fins are arranged substantially radially in this embodiment, but they may be arranged in a circular arc, spiral or other pattern. The air should not be necessarily discharged in four directions but it may be discharged in one, two or more directions.

(Second embodiment)

A second embodiment of the present invention will be described below by referring to the drawings.

Figure 6:
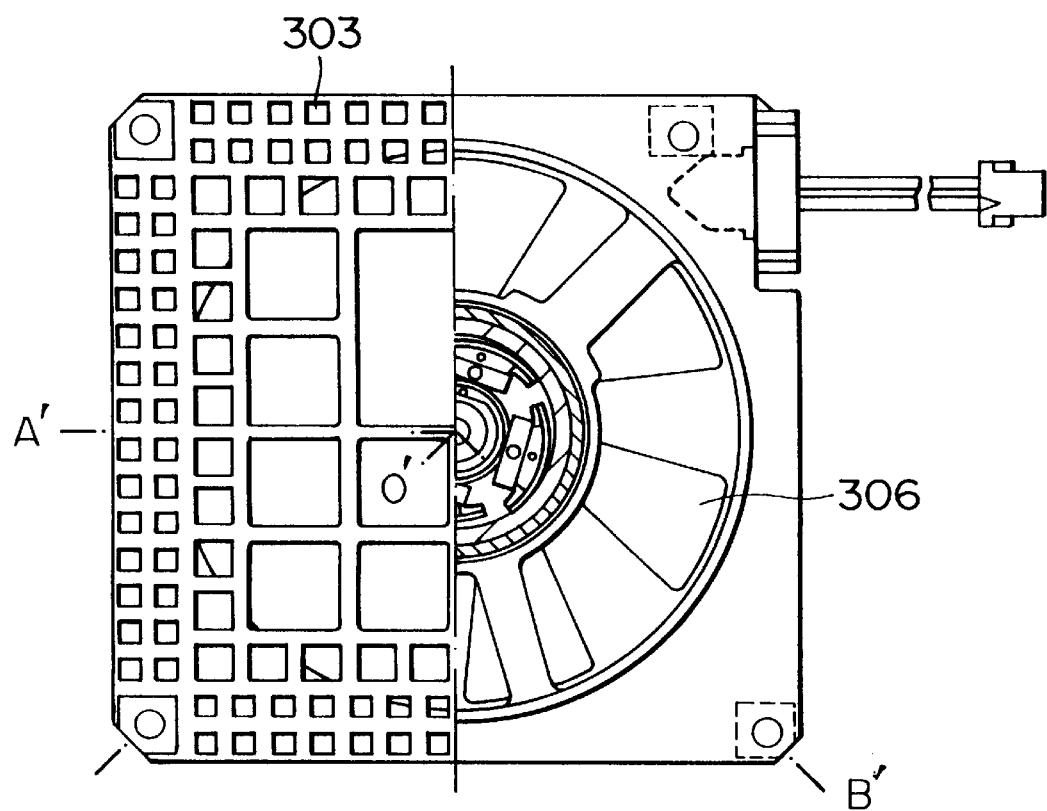
FIG. 6 is a plan view of a heat sink apparatus according to a second embodiment of the invention.
Figure 7:
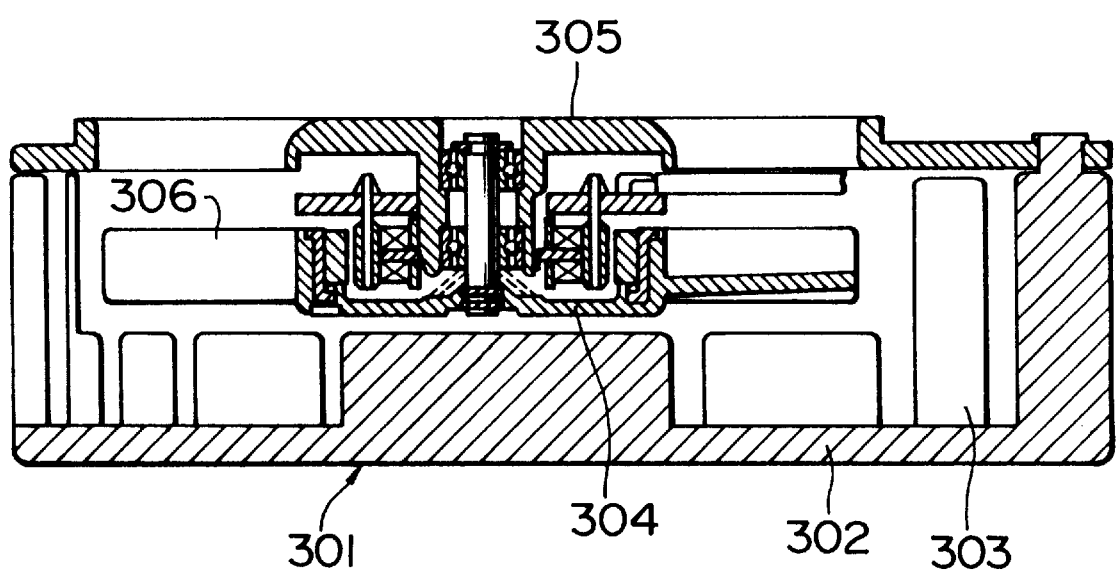
FIG. 7 is a sectional view of the heat sink apparatus according to the second embodiment of the invention taken along the line A'-O'-B' of FIG. 6.

FIG. 6 is a plan view of a heat sink apparatus according to a second embodiment of the invention, and FIG. 7 is a sectional view taken along the line A'-O'-B' of FIG. 6. This second embodiment is different from the first embodiment shown in FIGS. 1 and 2 in the configurations of the base and radiation fins of the heat sink. The motor, vanes and the other like, as well as the material of the heat sink, of the second embodiment, may be either the same as or changed in combination from those of the first embodiment. A base 302 of a heat sink 301 has flat surfaces, and a plurality of pin-shaped radiation fins 303 are provided on one of the flat surfaces of the base 302. The circumference of the fins 303 provided in the central portion of the base 302 is greater than that of the fins 303 provided in the peripheral portion thereof. In the peripheral portion of the base, the fins 303 are decreased in circumference so as to increase the number of the fins 303 per unit area. The height of the fins 303 is so decided that they are prevented from coming in contact with an impeller 304 and vanes 306 within the range of rotation of the vanes 306 and they reach a predetermined height of the heat sink 301 in the other range. The fins 303 are arranged so that the spacing between the adjacent fins is substantially equal. Such construction can be considered to be the same as a construction that the base 302 of the heat sink 301 is increased in thickness in the central portion thereof, and therefore it is possible to increase the surface area of the radiation fins 303 and, at the same time, the area of the cross section through which the air flow caused by the rotating vanes 306 is allowed to pass can be made larger in the peripheral portion of the heat sink 301. This makes it possible to obtain the same cooling effect as that of the heat sink apparatus of the first embodiment in which the thickness of the base 18 is made thick in the central portion 23 and thin in the peripheral portion 24 and the height of the fins 19 is made high at their portions located in the peripheral portion of the base 18. A motor 305 fixed to the four corners of the heat sink 301 by means of caulking or the like is the same one as employed in the first embodiment.

In this second embodiment, the radiation fins are square in plan but they can be circular, hexagonal or of any other shape. Further, the fins are arranged in a lengthwise and breadthwise crisscross pattern but they may be arranged in a radial, spiral, circular arc or other pattern. The fins are arranged so that the spacing between the adjacent fins is substantially equal, but they may be arranged so that the spacing between the adjacent fins in the peripheral portion of the heat sink is made wider.

The present invention may be embodied in other specific forms without departing from the spirit or essential characteristics thereof. The above embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A heat sink apparatus comprising: a base on which a heating element can be mounted; a plurality of fins provided on said base; a drive unit provided on said base; and vanes rotated by said drive unit, wherein a surface of said base on which the fins are provided is inclined so that said base is increased in thickness from its peripheral portion to its central portion.

2. A heat sink apparatus according to claim 1, wherein a sectional area of a groove between adjacent fins is smaller at its central portion than at its peripheral portion in the radial direction of an axis of rotation of the vanes.

3. A heat sink apparatus comprising: a heat sink having a base on one surface of which a heating element can be mounted and a plurality of fins provided on the other surface of said base; a drive unit at least a portion of which is fixed to said heat sink; and vanes rotated by said drive unit, wherein the surface of said base on which said fins are provided is inclined so that said base is increased in thickness from its peripheral portion to its central portion.

4. A heat sink apparatus according to claim 3, wherein the sectional area of each groove between the adjacent fins is smaller at its central portion than at its peripheral portion in the radial direction of an axis of rotation of the vanes.

5. A heat sink apparatus comprising: a heat sink having a base on one surface of which a heating element can be mounted and a plurality of fins provided on the other surface of said base; a drive unit at least a portion of which is fixed to said heat sink; and vanes rotated by said drive unit, wherein the surface of said base on which said fins are provided is inclined so that said base is increased in thickness from its peripheral portion to its central portion, and said fins are each extended from the edge of said base to a position below said vanes.

6. A heat sink apparatus according to claim 5, wherein the sectional area of each groove between the adjacent fins is smaller at its central portion than at its peripheral portion in the radial direction of an axis of rotation of the vanes.

7. A heat sink apparatus comprising: a heat sink having a base on one surface of which a heating element can be mounted and a plurality of fins provided on the other surface of said base; a drive unit at least a portion of which is fixed to said heat sink; and vanes rotated by said drive unit, wherein the surface of said base on which said fins are provided is inclined so that said base is increased in thickness from its peripheral portion to its central portion to increase the surface area of said fins in said peripheral portion.

8. A heat sink apparatus according to claim 7, wherein the sectional area of each groove between the adjacent fins is smaller at its central portion than at its peripheral portion in the radial direction of an axis of rotation of the vanes.

9. A heat sink apparatus comprising: a base on which a heating element can be mounted; a plurality of columnar fins provided on said base; a drive unit provided on said base; and vanes rotated by said drive unit, wherein said base is flat and the area of upper surfaces of said fins is larger in a central portion than in a peripheral portion in the radial direction of an axis of rotation of said vanes.

10. A heat sink apparatus comprising: a heat sink having a base on one surface of which a heating element can be mounted and a plurality of columnar fins provided on the other surface of said base; a drive unit at least a portion of which is fixed to said heat sink; and vanes rotated by said drive unit, wherein at least the area of upper surfaces of said fins is larger in a central portion than in a peripheral portion in the radial direction of an axis of rotation of said vanes.

11. A heat sink apparatus comprising: a heat sink having a base on one surface of which a heating element can be mounted and a plurality of columnar fins provided on the other surface of said base; a drive unit at least a portion of which is fixed to said heat sink; and vanes rotated by said drive unit, wherein at least the area of upper surfaces of said fins is larger in a central portion than in a peripheral portion in the radial direction of an axis of rotation of said vanes, and the sectional area of the spacing between the adjacent fins is smaller in the central portion than in the peripheral portion in the radial direction of the axis of rotation of the vanes.

12. A heat sink apparatus comprising:

a heat sink having a base on one surface of which a heating element can be mounted and a plurality of columnar fins provided on the other surface of said base;

a drive unit at least a portion of which is fixed to said heat sink; and vanes rotated by said drive unit, wherein at least the area of upper surfaces of said fins is larger in a central portion than in a peripheral portion in the radial direction of an axis of rotation of said vanes, and said fins are arranged in a pattern that extends from below said drive unit in said central portion outwardly to said peripheral portion.

13. A heat sink apparatus comprising:

a heat sink having a base on one surface of which a heating element can be mounted and a plurality of columnar fins provided on the other surface of said base;

a drive unit at least a portion of which is fixed to said heat sink; and vanes rotated by said drive unit, wherein at least the area of upper surfaces of said fins is larger in a central portion than in a peripheral portion in the radial direction of an axis of rotation of said vanes, and said fins are arranged in a pattern that extends from below said vanes in said central portion outwardly to said peripheral portion.

* * * * *